(12) United States Patent
Martinez et al.

(10) Patent No.: US 11,880,097 B2
(45) Date of Patent: Jan. 23, 2024

(54) HEADS UP DISPLAY WITH TEXTURED SURFACE

(71) Applicants: DENSO International America, Inc., Southfield, MI (US); Denso Corporation, Kariya (JP)

(72) Inventors: Juan Martinez, Farmington Hills, MI (US); Reben Werman, Sterling Heights, MI (US); Nicholas Triglia, Sterling Heights, MI (US)

(73) Assignees: DENSO International America, Inc., Southfield, MI (US); Denso Corporation

( * ) Notice: Subject to any disclaimer, the term of this patent is extended or adjusted under 35 U.S.C. 154(b) by 274 days.

(21) Appl. No.: 17/218,912

(22) Filed: Mar. 31, 2021

(65) Prior Publication Data

US 2022/0229292 A1 Jul. 21, 2022

Related U.S. Application Data

(60) Provisional application No. 63/138,000, filed on Jan. 15, 2021.

(51) Int. Cl.
*G02F 1/1335* (2006.01)
*G02B 27/01* (2006.01)
*G02B 5/30* (2006.01)
*H01L 27/12* (2006.01)

(52) U.S. Cl.
CPC ..... *G02F 1/133536* (2013.01); *G02B 5/3025* (2013.01); *G02B 27/0101* (2013.01); *H01L 27/1214* (2013.01)

(58) Field of Classification Search
None
See application file for complete search history.

(56) References Cited

U.S. PATENT DOCUMENTS

| 6,081,376 | A | * | 6/2000 | Hansen | G02F 1/133536 |
| | | | | | 359/485.05 |
| 9,126,858 | B2 | | 9/2015 | Park | |
| 9,952,375 | B2 | | 4/2018 | Nolan et al. | |
| 2007/0153384 | A1 | * | 7/2007 | Ouderkirk | G02B 1/14 |
| | | | | | 359/493.01 |
| 2013/0279016 | A1 | * | 10/2013 | Finger | G02B 27/01 |
| | | | | | 359/630 |
| 2018/0251398 | A1 | | 9/2018 | Ikegami et al. | |
| 2019/0171010 | A1 | | 6/2019 | Nambara | |
| 2020/0124908 | A1 | | 4/2020 | Mishiro et al. | |

(Continued)

FOREIGN PATENT DOCUMENTS

| CN | 107407758 | A | * | 11/2017 | ........... G02B 5/1861 |
| JP | 2009300655 | A | | 12/2009 | |

*Primary Examiner* — Phu Vu
(74) *Attorney, Agent, or Firm* — Dickinson Wright PLLC

(57) ABSTRACT

A heads-up display includes a thin-film transistor (TFT) panel, along with at least one reflective polarizer subassembly. Each of the at least one reflective polarizer subassembly includes a clear substrate having opposing first and second surfaces. The first surface is connected to the TFT panel, and the second surface has a polarizing film laminated thereto. The first surface of the clear substrate is textured, frosted, or the like such that when it is attached to the TFT panel it inhibits bonding between the clear substrate and the TFT panel that would cause optical defects.

20 Claims, 3 Drawing Sheets

(56) References Cited

U.S. PATENT DOCUMENTS

2020/0407274 A1   12/2020  Agnello et al.
2021/0141218 A1*  5/2021  Grandclerc ....... G02F 1/133606
2021/0149245 A1*  5/2021  Li ..................... G02F 1/133504

* cited by examiner

HEADS UP DISPLAY WITH TEXTURED SURFACE

CROSS-REFERENCE TO RELATED APPLICATIONS

This application claims the benefit of U.S. provisional application Ser. No. 63/138,000 filed on Jan. 15, 2021, the disclosure of which is hereby incorporated in its entirety by reference herein.

TECHNICAL FIELD

The present disclosure relates to a heads-up display (HUD) having a component therein provided with a textured surface.

BACKGROUND

Various automotive vehicles have a heads-up display (HUD) system. In a HUD system, a light source projects a light, which is reflected onto a windshield of the vehicle. The focal point of the light is out beyond the vehicle, enabling the driver of the vehicle to view the light on the windshield without changing focus while looking at the outside environment.

SUMMARY

In an embodiment, a heads-up display (HUD) assembly for a vehicle includes a first reflective polarizer subassembly and a second reflective polarizer subassembly. The first reflective polarizer subassembly includes a first clear substrate having an upper surface and a lower surface, and a first polarizing film bonded to the upper surface of the first clear substrate. The second reflective polarizer subassembly includes a second clear substrate having an upper surface and a lower surface, and a second polarizing film bonded to the upper surface of the second clear substrate. A thin-film transistor (TFT) panel is disposed between the lower surface of the first clear substrate and the upper surface of the second clear substrate. At least one of the lower surface of the first clear substrate and the upper surface of the second clear substrate is textured.

In an embodiment, a heads-up display (HUD) assembly includes a thin-film transistor (TFT) panel, and a reflective polarizer subassembly having a surface contacting the TFT panel in a face-to-face relationship. The surface of the reflective polarizer subassembly that contacts the TFT panel is textured.

In an embodiment, a thin-film transistor (TFT) subassembly for a heads-up display (HUD) includes a TFT panel having an upper surface and a lower surface, as well as a first reflective polarizer subassembly. The first reflective polarizer subassembly has a first clear substrate having a lower surface and an upper surface, and a first polarizing film laminated to the upper surface of the first clear substrate. The lower surface of the first clear substrate is textured and attached to the upper surface of the TFT panel.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

A heads-up display (HUD), also referred to as a head-up display, is a type of transparent display that presents data without requiring the user to look away from the usual environment. In vehicular applications, data can be presented on the windshield (for example), in a transparent and visually-unobstructed manner so that the driver can clearly see the surrounding environment while driving. Some data available for display on the windshield includes vehicle speed, turn-by-turn navigation instructions, warnings regarding surrounding objects, etc.

Figure 1:
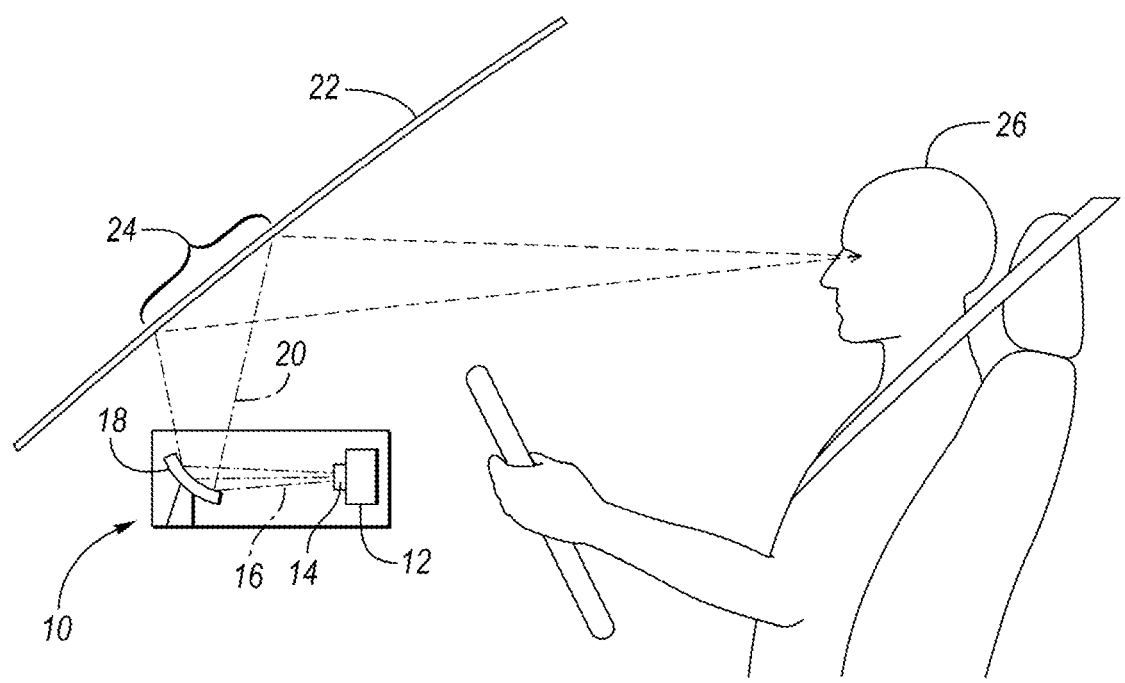
FIG. 1 illustrates a side schematic view of a HUD system, according to an embodiment.

FIG. 1 illustrates a general HUD system 10 according to one embodiment. The HUD system 10 is in a passenger vehicle, such as a car, truck, sports utility vehicle, van, and the like. In other embodiments, the HUD system 10 can be implemented in aviation, military, and other applications. The HUD system 10 includes various components beneath the dashboard of the vehicle. For example, the HUD system 10 can include a projector unit 12. For simplicity sake, the projector unit 12 is shown herein to have a light source 14, which can be a light-emitting diode (LED) light source located at the rear of the projector unit 12, for example. Light transmitted from the light source 14 is generally shown at 16. The light from the light source 14 is sent to a screen or visual display, such as thin-film transistor (TFT) or a reflective polarizer sub-assembly, in an embodiment. The TFT can create an image, and the LEDs can light up the image; in other words, the LEDs can be a backlight for the TFT. The light can then be reflected off of a mirror 18. The light reflected off of the mirror 18, shown generally at 20, passes through an aperture or transparent region of the dashboard and is reflected off the vehicle windshield 22 to the driver 26. The light shown on the windshield can be shown over an area 24 of the windshield that can, for example, overlay with the road ahead of the driver 26 from the driver's viewpoint.

It should be understood that FIG. 1 is a simplified view of an HUD system 10. As will be described below, the TFT (or, generally, the mirror 18) can be a subassembly of various structures, and is herein described as a reflective polarizer subassembly in various embodiments. Also, while not shown in FIG. 1, the HUD system 10 can include many other components to aid in the effective delivery of light to the windshield, such as collimators, lenses, additional mirrors, and other structure. While the HUD system 10 may include TFT, other screens or visual displays may be used, such as a liquid crystal display (LCD), liquid crystal on silicon (LCoS), digital micro-mirrors (DMDs), organic light-emitting diodes (OLEDs), or others made using a wide variety of semiconductor materials (e.g., silicon, glass, cadmium selenide, metal oxides, etc.) which is illuminated by the light from the light source as the light as it is projected to the windshield.

A reflective polarizer may be used to prevent sunlight from damaging the TFT surface. In the context of a HUD system, this reflective polarizer may be a thin film that is laminated to a clear substrate which is, in turn, installed on the TFT surface so that the clear substrate and the TFT touch. When the clear substrate touches the TFT, the two parts can undesirably and accidentally bond to each other to form surface tension, which can result in optical defects.

According to various embodiments described herein, one side of the clear substrate can be textured. The texturing of the clear substrate can inhibit the clear substrate from bonding with the TFT, thus preventing any accidental optical defects. As will be described herein, the texturing of the surface can be accomplished via surface roughness, frosting, or the like that roughens the surface enough without distorting the image displayed.

Figure 2:
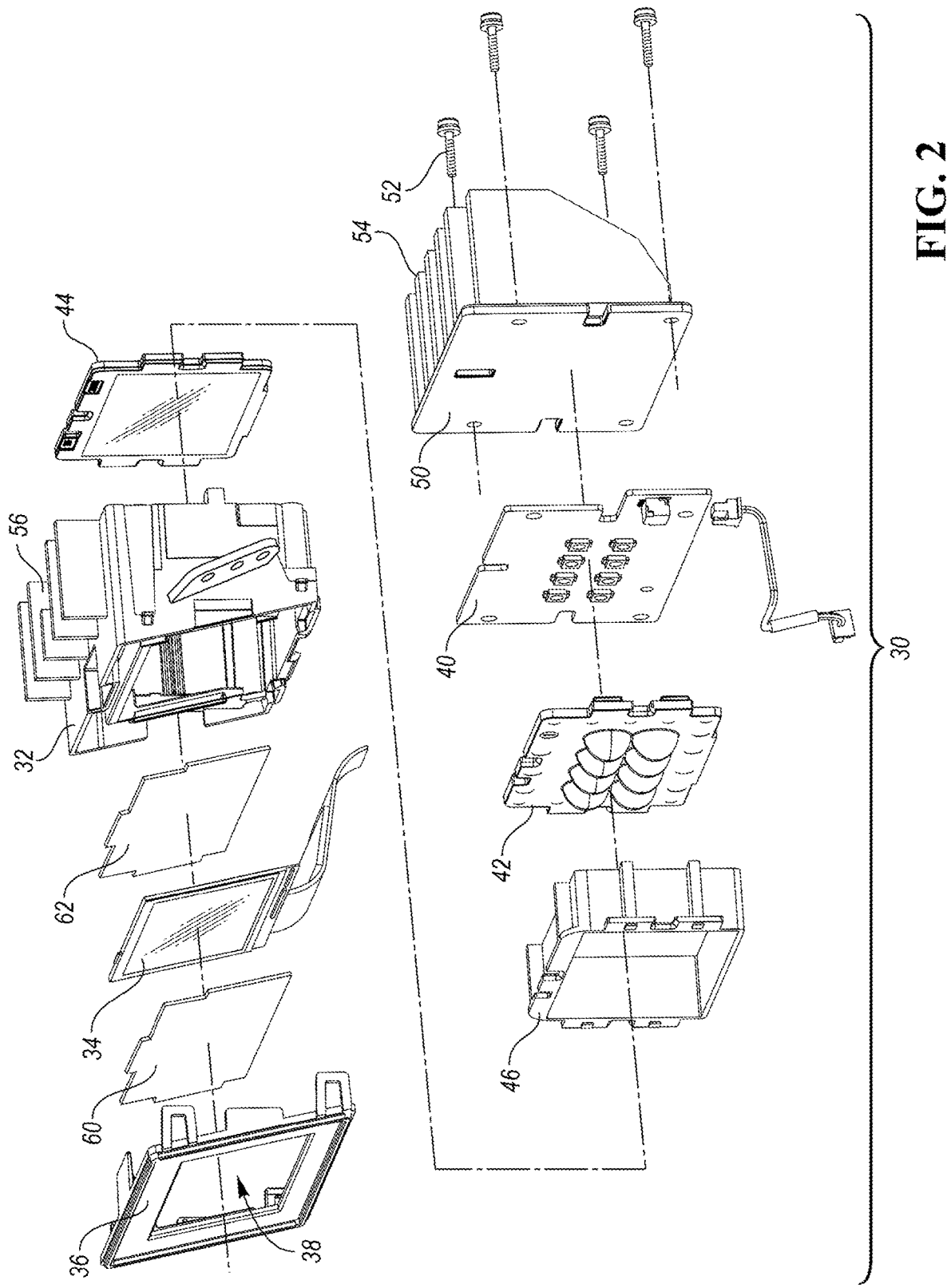
FIG. 2 illustrates an exploded perspective view of a HUD assembly, according to an embodiment.
Figure 3:
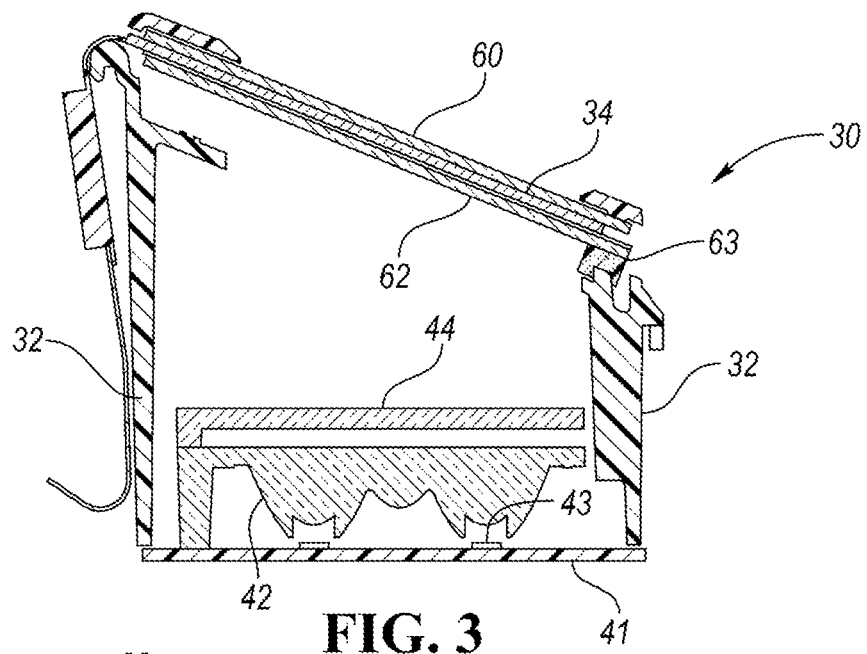
FIG. 3 illustrates a cross-sectional view of a HUD assembly, according to an embodiment.

FIG. 2 illustrates an exploded perspective view of an HUD assembly 30 according to an embodiment. FIG. 3 illustrates a cross-sectional view of a similar HUD assembly 30. The only differences between the views shown in FIG. 2 and FIG. 3 are in the overall shapes and inclusion of certain structure, and therefore similar reference numbers are used in both figures. Referring to FIGS. 2-3, the HUD assembly 30 includes a case 32, also referred to as an outer housing or assembly case. The TFT panel 34 may be a metal-oxide-semiconductor field-effect transistor (MOSFET), for example, which may be made by depositing thin films of an active semiconductor layer and a dielectric layer and metallic contacts over a supporting substrate (e.g., glass, etc.) The case 32 may support a TFT screen or TFT panel 34. The TFT panel 34 is also assembled to a cover 36 which has a central opening 38 aligned with the TFT panel 34 such that the illumination of the TFT panel 34 is visible through the opening 38. The orientation and positioning of the HUD assembly 30 can be such that the TFT panel 34 is directly aligned with an opening in the dashboard of the vehicle.

The HUD assembly 30 may also include a light source 40, such as one described above. In the illustrated embodiment, the light source 40 is an LED board, e.g., a printed circuit board (PCB) 41 with LEDs 43 arranged thereon. A first optical lens 42 including a plurality of individual lenses arranged on a lens board are also provided, with each lens aligned with a respective one of the LEDs, for example. A second optical lens 44 is also provided, spaced apart from the first optical lens 42. A lens spacer 46 may be provided, attached to both lenses 42, 44 and configured to maintain a spatial relationship between the lenses.

The HUD assembly 30 may also be provided with a heat sink 50 at a rear of the assembly, which is illustrated in the embodiment of FIG. 2. The heat sink 50 can be attached directly to the case 32, for example. A plurality of fasteners (e.g., screws, bolts, etc.) 52 can extend through apertures formed in the heat sink 50 to connect to corresponding holes in the board of the light source 40 to connect the two. The heat sink 50 may be provided with fins 54 for dispersion of heat. Similarly, the case 32 may be provided with fins 56 for dispersion of heat.

The HUD assembly 30 also includes at least one reflective polarizer subassembly. In the illustrated embodiments of FIG. 2 and FIG. 3, there are two reflective polarizer subassemblies, namely a first reflective polarizer subassembly 60 and a second reflective polarizer subassembly 62. But, it should be understood that the teachings provided herein can be applied to a HUD system in which only a single reflective polarizer subassembly is provided, e.g., on only one side of the TFT panel 34.

In the illustrated embodiment, a TFT sandwich is created with the TFT panel 34 in between and directly contacting the first polarizer subassembly 60 and the second polarizer subassembly 62. The first polarizer subassembly 60 is configured to keep sunlight from shining on the TFT panel 34, while the second polarizer subassembly 62 is configured to reflect some light from the light source 40 away from the TFT panel 34 to prevent the TFT panel 34 from overheating.

In an embodiment, the second polarizer subassembly 62 does not directly contact the case 32. Instead, a piece of foam 63 or other insulative material may be provided between the second polarizer subassembly 62 and the case. The foam 63 may be placed at various spaced-apart locations about the perimeter along one side of the second polarizer subassembly, for example.

Figure 4:
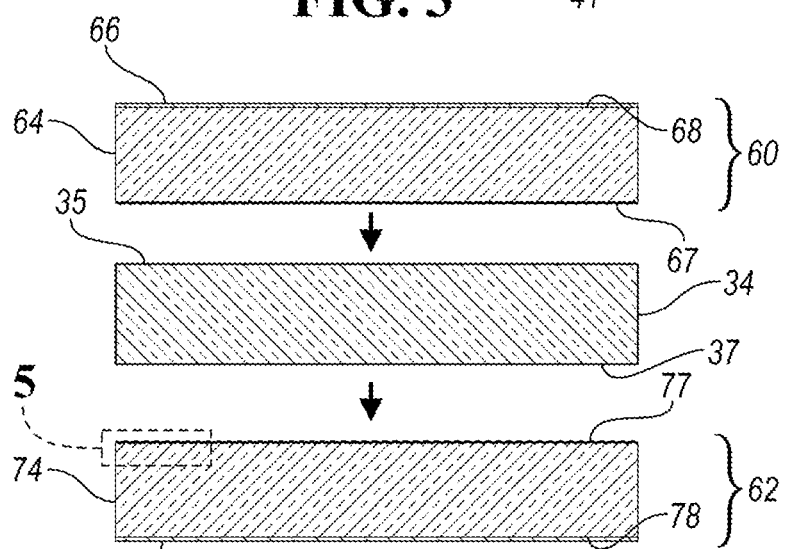
FIG. 4 is an enlarged view of a portion of FIG. 3 and illustrates a cross-section of a reflective polarizer sub-assembly, according to an embodiment.
Figure 5:
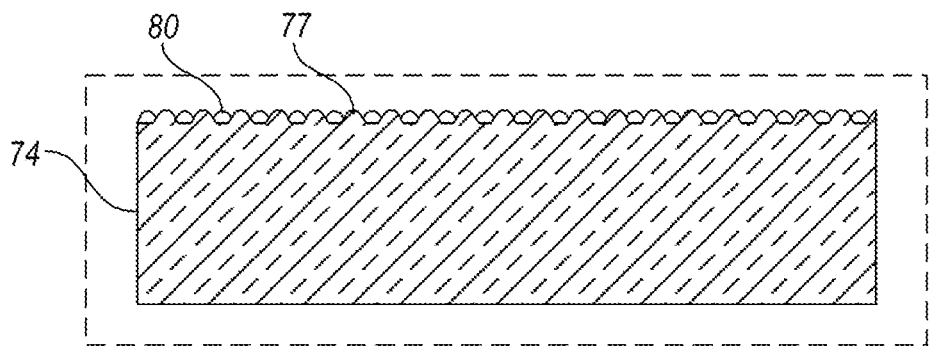
FIG. 5 is an enlarged view of a portion of FIG. 4 illustrating a textured surface on one of the layers of material of the reflective polarizer sub-assembly, according to an embodiment.

FIG. 4 illustrates an enlarged view of the TFT sandwich, namely the TFT panel 34 between the first polarizer subassembly 60 and the second polarizer subassembly 62. This can also be referred to as a TFT subassembly. FIG. 5 is an enlarged view of a side of the polarizer subassemblies that faces and directly contacts the TFT panel 34. FIG. 5 is an enlarged view of an upper surface of the second polarizer subassembly, but the surface features described herein can also be present on the lower of the first subassembly 60. In other words, the surface features described herein can be on both polarizer subassemblies 60, 62 on a respective surface thereof that contacts the TFT panel 34.

Each reflective polarizer subassembly includes a polarizing film connected to a clear substrate. In particular, the first polarizer subassembly 60 includes a first clear substrate 64 and a first polarizing film 66, and the second polarizer subassembly 62 includes a second clear substrate 74 and a second polarizing film 76. The first clear substrate 64 and second clear substrate 74 may be polymethyl methacrylate (PMMA), also referred to as acrylic, acrylic glass, or plexiglass. The first polarizing film 66 and the second polarizing film 76 may be a film reflective polarizer (FRP) or other similar polarizing film that is laminated to the respective clear substrate. Each polarizing film 66, 76 may itself include multiple layers of films, although only a single layer is shown in the illustrated embodiment. The polarizing films 66, 76 are may include a combination of polymer and multilayer film technology configured to recycle some of the rejected polarization to increase light output. In particular, the polarizing films 66, 76 may reflect one plane of light polarization and transmit or reflect the other.

The first clear substrate 64 has a lower surface 67 and an opposing upper surface 68. The lower surface 67, when assembled to the TFT panel 34, directly contacts an upper surface 35 of the TFT panel 34. In other embodiments, there is an air gap between the lower surface 67 and the upper surface 35. The upper surface 68 of the first clear substrate 64 is covered by the first polarizing film 66, which can be laminated thereto.

The second clear substrate 74 has an upper surface 77 and an opposing lower surface 78. The upper surface 77, when assembled to the TFT panel 34, directly contacts a lower surface 37 of the TFT panel 37. In other embodiments, there is an air gap between the upper surface 77 and the lower surface 37. The lower surface 78 of the second clear substrate 74 is covered by the second polarizing film 76, which can be laminated thereto.

As explained above, optical defects in the output of the HUD system 10 are undesirable, and might derive from accidentally bonding between the lower surface 67 of the first clear substrate 64 and the upper surface 35 of the TFT panel 34, and/or from accidental bonding between the upper surface 77 of the second clear substrate 74 and the lower surface 37 of the TFT panel 34. Therefore, as disclosed herein, the lower surface 67 and/or the upper surface 77 may be textured or roughened to inhibit these accidental bonds. This is represented by the roughened surface features shown in FIG. 4.

FIG. 5 is an enlarged view of the upper surface 77 of the second clear substrate 74, illustrating one example of surface features 80 formed thereon. It should be understood that the described surface features 80 may also be provided on the lower surface 67 of the first clear substrate 64.

The surface features 80 may be undulations, ridges, bumps, humps, etches, scratches, or the like that are configured to roughen the upper surface 77. The surface features 80 may be the result of frosting the upper surface 77 such that the upper surface is a frosted surface, for example. Glass-etching cream or other similar abrasive materials can be used to roughen the upper surface 77 and create the surface features 80. In yet other embodiments, the surface features 80 are formed from polishing such as tape polishing, abrasive polishing, chemical mechanical polishing (CMP), or the like. In other embodiments, a texture is etched onto surfaces of the mold (e.g., glass) that are used to mold the clear substrates 64, 74, so that the texture is applied to the clear substrates 64, 74 during formation similar to applying texture onto injection molded parts. The upper surface 77 can therefore be referred to as an etched surface, a frosted surface, a textured surface, an uneven surface, or the like.

The textured surface described herein prevents bonding or adhesion between the TFT panel 34 and either or both of the clear substrates 64, 74. By texturing or roughening the surface of the clear substrate 64, 74 that comes in contact with the TFT panel 34, image distortion resulting from accidental bonding is removed while the clarity, intensity, evenness, and sharpness of the displayed image output by the HUD system 10 is not noticeably impacted.

While references herein are made to "upper" and "lower" surfaces of the various components, it should be understood that these are merely referring to the orientation shown in the figures. These terms are not to be limiting to the actual orientation of the product in production, but merely refer to the orientation shown in the figures. For example, while it has been described that the lower surface 67 of the clear substrate 64 is textured, and the upper surface 77 of the clear substrate 74 is textured, it can alternatively be stated that each clear substrate has opposing first and second surfaces, and one of the surfaces is textured. The other of the two opposing surfaces may not be textured, e.g., may be smooth, clear, and free from any ridges, etches or other purposefully-manufactured surface features.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A heads-up display (HUD) assembly for a vehicle, the HUD assembly comprising:
    a first reflective polarizer subassembly having:
        a first clear substrate having an upper surface and a lower surface, and
        a first polarizing film bonded to the upper surface of the first clear substrate;
    a second reflective polarizer subassembly having:
        a second clear substrate having an upper surface and a lower surface, and
        a second polarizing film bonded to the lower surface of the second clear substrate;
    a thin-film transistor (TFT) panel disposed between the lower surface of the first clear substrate and the upper surface of the second clear substrate;
    wherein at least one of the lower surface of the first clear substrate and the upper surface of the second clear substrate is textured.

2. The HUD assembly of claim 1, wherein the TFT panel contacts the lower surface of the first clear substrate, and wherein the lower surface of the first clear substrate is textured.

3. The HUD assembly of claim 1, wherein the TFT panel contacts the upper surface of the second clear substrate, and wherein the upper surface of the first clear substrate is textured.

4. The HUD assembly of claim 1, wherein the at least one of the lower surface of the first clear substrate and the upper surface of the second clear substrate is frosted.

5. The HUD assembly of claim 1, wherein the at least one of the lower surface of the first clear substrate and the upper surface of the second clear substrate is provided with a plurality of surface features.

6. The HUD assembly of claim 5, wherein the surface features are ridges, bumps, or etches.

7. A heads-up display (HUD) assembly comprising:
    a thin-film transistor (TFT) panel; and
    a reflective polarizer subassembly having a surface contacting the TFT panel in a face-to-face relationship, wherein the surface of the reflective polarizer subassembly is textured.

8. The HUD assembly of claim 7, wherein the surface is a first surface, wherein the reflective polarizer subassembly includes a first clear substrate having the first surface and an opposing second surface, and a first polarizing film bonded to the second surface.

9. The HUD assembly of claim 8, wherein the second surface is not textured and is smooth.

10. The HUD assembly of claim 8, wherein reflective polarizer subassembly is a first reflective polarizer subassembly, wherein the HUD assembly includes a second reflective polarizer subassembly having a second clear substrate having a first surface contacting the TFT panel and an opposing second surface, wherein the first surface of the second reflective polarizer is textured.

11. The HUD assembly of claim 10, wherein the second reflective polarizer subassembly includes a second polarizing film bonded to the second surface of the second clear substrate.

12. The HUD assembly of claim 8, wherein the surface of the reflective polarizer subassembly is provided with a plurality of surface features.

13. The HUD assembly of claim 12, wherein the surface features are ridges, bumps, or etches.

14. The HUD assembly of claim 8, wherein the surface of the reflective polarizer subassembly is frosted.

15. A thin-film transistor (TFT) subassembly for a heads-up display (HUD), the TFT subassembly comprising:
a TFT panel having an upper surface and a lower surface;
a first reflective polarizer subassembly having:
a first clear substrate having a lower surface and an upper surface, and
a first polarizing film laminated to the upper surface of the first clear substrate;
wherein the lower surface of the first clear substrate is textured and attached to the upper surface of the TFT panel.

16. The TFT subassembly of claim 15, wherein the lower surface of the first clear substrate is in direct contact with the upper surface of the TFT panel.

17. The TFT subassembly of claim 16, further comprising:
a second reflective polarizer subassembly having:
a second clear substrate having a lower surface and an upper surface, and
a second polarizing film laminated to the lower surface of the second clear substrate;
wherein the upper surface of the second clear substrate is textured and attached to the lower surface of the TFT panel.

18. The TFT subassembly of claim 17, wherein the upper surface of the second clear substrate is in direct contact with the lower surface of the TFT panel.

19. The TFT subassembly of claim 18, wherein the first clear substrate and the second clear substrate are polymethyl methacrylate (PMMA).

20. The TFT subassembly of claim 15, wherein the lower surface of the first clear substrate is frosted.

* * * * *